United States Patent [19]

Adler et al.

[11] 4,259,683
[45] Mar. 31, 1981

[54] HIGH SWITCHING SPEED P-N JUNCTION DEVICES WITH RECOMBINATION MEANS CENTRALLY LOCATED IN HIGH RESISTIVITY LAYER

[75] Inventors: Michael S. Adler, Schenectady; Victor A. K. Temple, Clifton Park, both of N.Y.

[73] Assignee: General Electric Company, Schenectady, N.Y.

[21] Appl. No.: 935,742

[22] Filed: Aug. 21, 1978

Related U.S. Application Data

[63] Continuation-in-part of Ser. No. 766,614, Feb. 7, 1977, abandoned.

[51] Int. Cl.³ ........................................ H01L 29/167
[52] U.S. Cl. .................................. 357/64; 357/34; 357/58; 357/91; 357/38
[58] Field of Search ................... 357/38, 58, 64, 34, 357/91

[56] References Cited

U.S. PATENT DOCUMENTS

| | | | |
|---|---|---|---|
| 3,335,337 | 8/1967 | Kasugai et al. | 357/64 |
| 3,419,764 | 12/1968 | Kasugai et al. | 357/64 |
| 3,440,113 | 4/1969 | Wolley | 357/64 |
| 3,553,536 | 1/1971 | Neilson | 357/64 |
| 3,728,592 | 4/1973 | Joshi et al. | 357/64 |
| 3,877,997 | 4/1975 | Brown | 357/91 |
| 4,056,408 | 11/1977 | Bartko et al. | 357/64 |
| 4,117,505 | 9/1978 | Nakata | 357/38 |

Primary Examiner—Joseph E. Clawson, Jr.
Attorney, Agent, or Firm—Geoffrey H. Krauss; Marvin Snyder; James C. Davis

[57] ABSTRACT

A semiconductor device for operation at high switching speeds includes a region of reduced carrier lifetime situated in the portion of the device in which the peak amount of carrier recombination occurs during device turn-off. This region of reduced carrier lifetime causes fast carrier recombination during device turn-off such that device switching speed is correspondingly increased over that of comparable conventional devices.

9 Claims, 23 Drawing Figures

HIGH SWITCHING SPEED P-N JUNCTION DEVICES WITH RECOMBINATION MEANS CENTRALLY LOCATED IN HIGH RESISTIVITY LAYER

This is a continuation-in-part of application Ser. No. 766,614, filed Feb. 7, 1977 now abandoned.

BACKGROUND OF THE INVENTION

This invention relates to semiconductor junction devices and more particularly to semiconductor junction devices exhibiting increased carrier recombination in selected portions thereof in order to achieve high speed operation.

DESCRIPTION OF THE PRIOR ART

It is known that doping semiconductor devices with impurities such as gold results in faster excess carrier recombination during turn-off of the device such that the switching speed is correspondingly increased. In semiconductor devices of the prior art such impurity doping was applied to large areas of the device. Significant desirable decreases in device turn-off time were achieved; however, an attendant increase in device forward voltage drop was caused by such wide area impurity doping. Various impurity profiles have been used in junction semiconductor devices in attempting to achieve high switching speeds while simultaneously increasing device forward voltage drop as little as possible.

"Gold sinkers" (i.e. columns of gold impurities) have been sunk by diffusion from the surface of semiconductor devices down into the bulk. Such gold dopants consume a relatively small portion of the volume of the device and still increase carrier recombination during device turn-off resulting in increased switching speed. However, in this approach the gold sinker region is oriented parallel to carrier current flow through the device, such that charge carriers flow along the entire length of the gold sinker region from one end of this region to the other, resulting in a significant undesirable increase in device forward voltage drop.

U.S. Pat. No. 3,728,592, issued Apr. 17, 1973 to Joshi et al. discloses a Semiconductor Structure Having Reduced Carrier Lifetime. Joshi et al. set forth a planar transistor with a high gold dopant impurity concentration throughout the emitter region and a gold impurity concentration peak at the base-collector junction. Device switching speed is significantly increased by such a wide area gold impurity diffusion into the transistor device.

Jerry L. Brown in his U.S. Pat. No. 3,877,997 issued Apr. 15, 1975, "Selective Irradiation For Fast Switching Thyristor With Low Forward Voltage Drop", discloses a thyristor semiconductor device with increased switching speed in which a mask is used to selectively irradiate portions of the thyristor device, causing regions of reduced carrier lifetime to extend from the surface of the device downward into its bulk.

U.S. Pat. No. 3,943,549, issued to Jaecklin et al. discloses a thyristor having improved high frequency performance. Relatively large portions of the N zone base substrate layer are doped with gold or nickel impurities to increase carrier recombination in this base substrate layer. Apparently these regions of reduced carrier lifetime are created by diffusing the appropriate impurity dopant into the surface of the anode layer through the anode region and into the N zone base substrate layer therebelow.

The present invention concerns a semiconductor device in which carrier recombination during device turn-off is enhanced at an optimal location within the device. Such selective enhancement of carrier recombination within the device results in decreased switching time and low forward voltage drop.

It is one object of this invention to provide a semiconductor device capable of high speed switching.

A further object of this invention is to provide a semiconductor device with low forward voltage drop.

These and other objects of the invention will become apparent to those skilled in the art upon consideration of the following description of the invention.

BRIEF SUMMARY OF THE INVENTION

The present invention is directed toward decreasing switching time of semiconductor junction devices while maintaining a low forward voltage drop in the device.

In accordance with one preferred embodiment of the invention, a PIN semiconductor diode is provided including a layer of P-type semiconductor material, a layer of intrinsic semiconductor material I, and a layer of N-type semiconductor material in a sandwich-like relationship. A P-I junction is formed between the P-type layer and the I-type layer and an I-N junction is formed between the I layer and the N-type layer. The P-type layer and the N-type layer are each provided with an electrical contact for connecting the PIN diode to external electrical circuitry.

To enhance carrier recombination during device turn-off and to thereby increase device switching speed, a region of reduced carrier lifetime is situated within the intrinsic semiconductor layer I including, and substantially limited to, the portion of the volume of the I layer in which the peak amount of carrier recombination occurs during turn-off of the diode. (Such a diode is turned on by application of a forward biased voltage to its electrical contacts and conversely is turned off by removal of such forward bias voltage and application of a reverse bias voltage to these electrical contacts.) This region of reduced carrier lifetime is oriented generally perpendicular to the flow of current through the diode. Generally, this region of reduced carrier lifetime is situated near the middle portion of the layer of intrinsic semiconductor material and is thus located a substantial distance from the P-I and I-N junctions.

A further embodiment of the invention comprises a transistor including a lightly doped collector region and a base region with a collector-base junction situated therebetween. The transistor of the invention further includes an emitter region with an emitter-base junction situated between the emitter region and the base region. The collector, base and emitter regions are each provided with an electrical contact situated thereon to connect the transistor device to external electrical circuitry. (Turn-on and turn-off of the collector-to-emitter current of the transistor is controlled by application of base current to the base electrical contact.)

To increase the switching speed of the transistor without substantially increasing forward voltage drop, a region of reduced carrier lifetime is situated within the lightly doped collector region including and substantially limited to the portion of the volume of the collector region in which the peak amount of carrier recombination occurs during turn-off of the collector-to-emitter current of the transistor. This region of reduced carrier lifetime is oriented generally perpendicular to the flow of collector-to-emitter current through the device. Further, the region of reduced carrier lifetime is situated near the middle portion of the lightly doped collector region and is thus located at a substantial distance from the collector-to-base junction.

Another embodiment of the invention comprises a four layer thyristor semiconductor device including a cathode layer, a first base layer, a lightly doped second base layer and an anode layer of alternate conductivity types. First, second and third P-N junctions are situated between each of these respective layers. Each of the cathode, first base and anode layers are provided with an electrical contact for connecting the thyristor to external electrical circuitry. The thyristor semiconductor device is adapted for electrical switching and exhibits a first relatively low resistance turned-on state and a second relatively high resistance turned-off voltage blocking state. The state of the thyristor device is controlled by current applied to the first base layer.

To enable the thyristor device to operate at high switching speeds, it is provided with a region of reduced carrier lifetime situated within the lightly doped second base layer. This region of reduced carrier lifetime includes, and is substantially limited to, the portion of the volume of the lightly doped second base layer in which the peak amount of carrier recombination occurs during the second stage of turn-off of the thyristor. The region of reduced carrier lifetime is oriented generally perpendicular to the flow of current from the cathode to the anode of the device and is generally situated near the middle portion of the second base layer.

In each of the diode, transistor and thyristor embodiments discussed above, the device simultaneously exhibits high switching speed and low forward voltage drop. The particular device has a low forward voltage drop because the effective size of the region of reduced carrier lifetime is relatively small and because it is oriented perpendicular to carrier current flow through the device. Thus, charge carriers flowing through the device are in the region of reduced carrier lifetime only for a relatively small amount of time, such that the region of reduced carrier lifetime does not contribute significantly to the forward voltage drop of the device.

It can be seen that the smaller the region of reduced carrier lifetime, correspondingly the smaller the increase of forward voltage drop of the device. However, the volume of this region of reduced carrier lifetime must be sufficiently large to provide enough recombination centers to remove charge carriers during device turn-off.

The features of the invention believed to be novel are set forth with particularity in the appended claims. The invention itself, however, both as to organization and method of operation, together with further objects and advantages thereof, may best be understood by reference to the following description taken in conjunction with the accompanying drawings.

DESCRIPTION OF THE DRAWINGS

FIG. 1, including graphs 1a and 1b, illustrates the time dependent turn-off characteristics of a typical thyristor semiconductor device.

DETAILED DESCRIPTION OF THE PREFERRED EMBODIMENT

The turn-off of a semiconductor device occurs in two stages. During the first stage of turn-off, excess carriers which, prior to turn-off, are physically located near the end regions of the device are rapidly swept away from the device under the influence of the electrical potential applied thereto. This first stage of device turn-off occurs very quickly relative to the second stage of turn-off where excess carriers are removed from the active region of the device. We can define "active region" as that region which, when the device is turned on and carrying its peak current, has a minority carrier charge density in excess of the background acceptor or donor concentration. Carrier recombination is the mechanism whereby most excess carriers are removed from the active regions of the device during this second stage of turn-off.

The overall turn-off time of a semiconductor device of the type with which this invention is concerned may be significantly improved by reducing the time required for this second stage of recombination to occur. The rate of carrier recombination may be accelerated in devices of this type by the addition of excess recombination centers into the device. This may be accomplished by addition of lifetime poisoning impurities (dopants) to appropriate regions within the semiconductor device. Applying such dopant (for example, gold) to large portions of the device results in significant undesirable increases in forward voltage drop. In accordance with the invention, a region of reduced carrier lifetime formed by such dopants is situated within the particular semiconductor layer of the device in which it is desired to increase the rate of carrier recombination during the second stage of turn-off. More specifically, this region of reduced carrier lifetime is situated within the particular semiconductor layer including, and substantially limited to, the portion of the volume thereof in which the peak amount of carrier recombination occurs during the second stage of device turn-off.

During the second stage of turn-off of a semiconductor device, varying amounts of charge carriers are recombined in different portions of the device. At some location within the device, generally near the physical center of the active region, the carrier recombination is at a maximum or peak amount.

It must be noted that the region of reduced carrier lifetime occupies a very small volume relative to the totality of the volume of the entire semiconductor device. Typically, the volume of the region of reduced carrier lifetime is less than 25% of the volume of the particular semiconductor layer in which it is situated. Thus, this region of reduced carrier lifetime does not significantly increase the forward voltage drop of the semiconductor device.

The region or regions of semiconductor material between the region of reduced carrier lifetime and any nearby P-N junctions of the particular device (whether diode, transistor or thyristor) exhibit a carrier recombination lifetime greater than that of the region of reduced carrier lifetime. Typically, the region of reduced carrier lifetime has a carrier lifetime less than 60% of the carrier lifetime within the particular semiconductor layer in which it is situated.

In accordance with the invention, a region of reduced carrier lifetime may be incorporated into several kinds of junction semiconductor devices such as diodes, PIN diodes, transistors, thyristors and the like in order to increase their switching speeds. Each of these devices includes a lightly doped semiconductor layer in which it is desirable to increase the rate of carrier recombination. For example, the PIN diode contains an intrinsic layer I which may be considered to be a lightly doped layer. The collector region of a transistor as well as the second base layer of a thyristor are lightly doped.

Generally, the region of reduced carrier lifetime is situated in the particular semiconductor device in the middle portion of the lightly doped layer in which it is desired to increase the rate of carrier recombination. (The lightly doped layer of the particular device corresponds highly with the active region of the device. Thus, it may be said that the region of reduced carrier lifetime is situated in the middle portion of the active region of the semiconductor device, whether the device is a diode, transistor or thyristor.) This middle portion of the lightly doped layer corresponds to the location where the peak amount of carrier recombination occurs during the second stage of turn-off of the device. Further, the region of reduced carrier lifetime is oriented approximately perpendicular to the flow of current through the selected semiconductor device. Since the region of reduced carrier lifetime is situated in the middle portion of the lightly doped layer of the device, it is normally a substantial distance from any nearby PN junction.

Figure 1A:
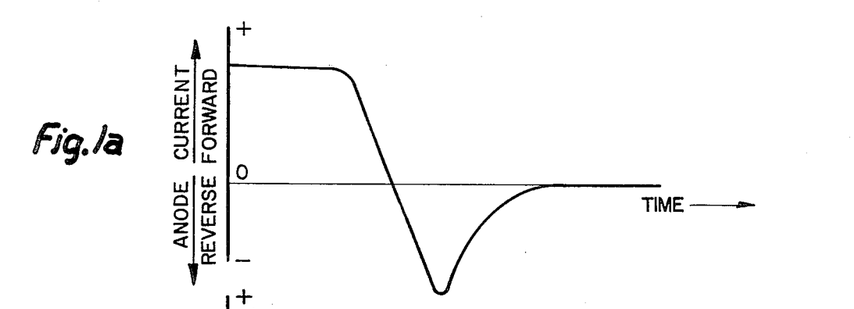
Figure 1B:
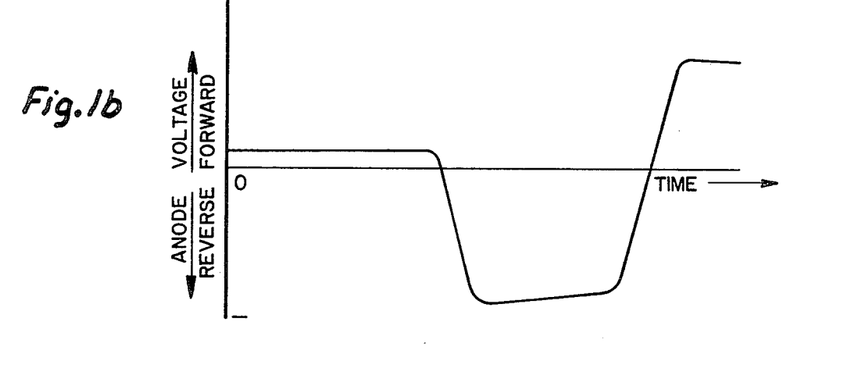

Referring now to FIGS. 1a and 1b wherein the anode current and anode voltage respectively of a reverse biased thyristor are illustrated to show the turn-off mechanism of such devices, two stages may be clearly seen. It will be readily understood by those skilled in the art that a thyristor includes three junctions, two end junctions and a center junction. In turn-off, a reverse voltage is applied to the device and holes and electrons in the vicinity of the two end junctions are swept out through these junctions and result in a reverse current to the external circuit. These carriers are largely controlled by the applied reverse electric field in the device. During this time as illustrated in FIG. 1a, the anode current decreases rapidly to zero and then increases to a negative value as carriers are removed. During this period, as seen at FIG. 1b, the anode voltage remains positive. After the holes and electrons in the vicinity of the end junctions have been removed, the reverse current decays toward zero as is seen in FIG. 1a, the end junctions having become reverse biased and having assumed a voltage blocking state.

The reverse voltage across the thyristor at this time is determined by the external circuit. The turn-off mechanism up to this point is considered to be the first stage of turn-off. The device is not, however, completely turned off insofar as the reapplication of a forward voltage at this time will result in a turning on of the device since a high concentration of excess carriers still exists near the center of the active region which closely, coincides with the center of the lightly doped layer of the thyristor. These excess carriers are removed by the process of recombination in a manner which is largely independent of the externally applied voltages. After the excess carrier concentration has decreased, through recombination, to a sufficiently low value, the center junction will regain its blocking state and a forward voltage less than the breakover voltage may be applied to the thyristor without causing turn-on. Typically, the time required for the excess carriers near the center junction to be removed through recombination is substantially greater than the time required for the carriers near the end junctions to be removed in the first turn-off stage. Accordingly, this invention is concerned with decreasing the time required to complete the second stage of turn-off.

In accordance with this invention, the center of the lightly doped region of the device wherein excess carriers are present in sufficient quantity to cause the device to remain on is the most crucial. The middle of this region is the target for our limited region of low carrier lifetime.

Figure 2:
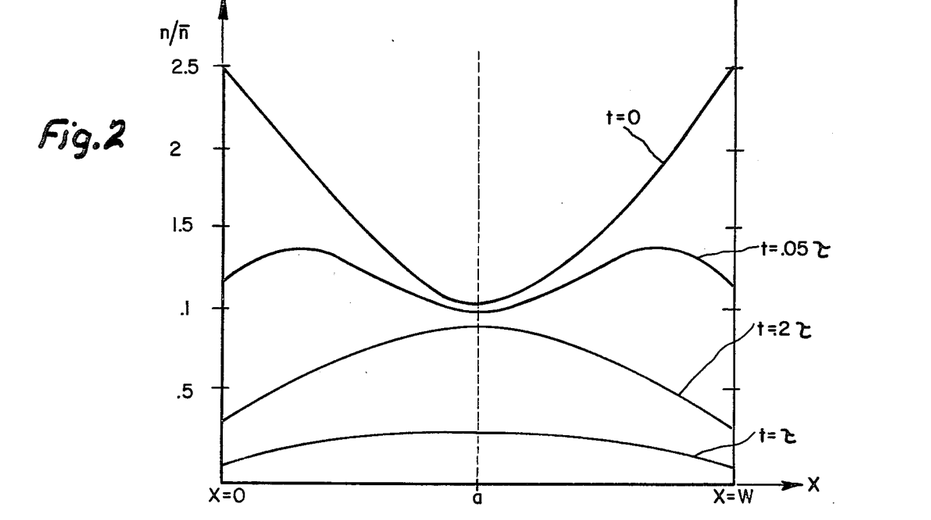
FIG. 2 is a graphical representation of the excess carrier concentration in the active region of a thyristor further illustrating the two stages of device turn-off to be described later.

FIG. 2 graphically illustrates the distribution of excess carriers in the active region of a thyristor device.

The number n of excess carriers is expressed as a ratio with the average number $\bar{n}$ of carriers in the on stage of the device. The various distributions of FIG. 2 occur at the times t illustrated which are referenced to the recombination lifetime $\tau$. It will be seen by reference to FIG. 2 that the excess carriers towards the ends of the active region are quickly removed as was hereinabove discussed, being reduced to approximately half of their preturn-off value, for example, within approximately 5.0% of the recombination lifetime of the region. The excess carriers in the center of the active region, however, are not substantially reduced at all during this short time and, in fact, remain at a substantial level for an appreciable portion of the recombination lifetime as is evident from the figures. As was hereinabove described, the turn-off process proceeds in what may be considered to be two stages. While there is no clear separation between the stages, reference to FIG. 2 suggests that the second stage may be considered to begin sometime after $t=0.05\tau$ and before $t=0.2\tau$.

Figure 3:
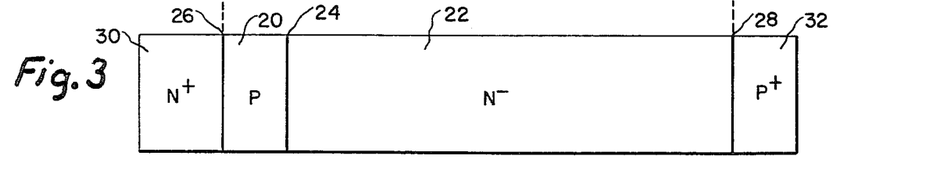
FIG. 3 is a representation of the four layers of a thyristor semiconductor device on the same scale as the abscissa of FIG. 2.

FIG. 3 schematically illustrates the structure of a thyristor device on the same distance scale as the abscissa of FIG. 2. Reference to FIGS. 2 and 3 together illustrates the extent of the active area of the device of FIG. 3 which includes p-base region 20 and n-base region 22. Junction 24 is the center junction hereinabove described while junctions 26 and 28 are the outer junctions. N+ region 30 is the n-emitter of the device while p+ region 32 is the p-emitter. It will be understood by those skilled in the art that a device of the type illustrated in FIG. 3 may be conventionally manufactured by appropriate diffusion into an n-type substrate of regions 30, 20 and 32.

Figure 4:
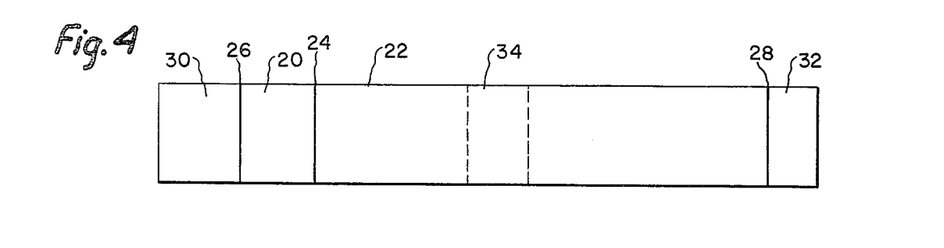
FIG. 4 is a representation of a thyristor semiconductor device in accordance with this invention showing the proper location of the limited low lifetime region in the device.

FIG. 4 also drawn to the same scale as FIG. 2 illustrates a thyristor in accordance with the instant invention including all of the same semiconductor layers and junctions as the device of FIG. 3. The device of FIG. 4 additionally includes a region 34 of relatively low lifetime located within n-conductivity type base region 22 at that point within the active region which exhibits the highest excess carrier concentration during the second stage of turn-off as will be appreciated by reference to FIG. 2 and which is designated therein as point a. In accordance with this invention, advantages are immediately obtained as the lifetime of region 34 is reduced below the lifetime of region 22. The extent of reduction may therefore be selected to provide desired operating characteristics and may vary over a wide range without deparing from the true spirit and scope of this invention. Preferably, lifetimes in the limited region on the order of 10 to 20% of the lifetime of region 22 provide substantial improvement in turn-off time (on the order of 2-4 times faster) over prior art devices.

Figure 5:
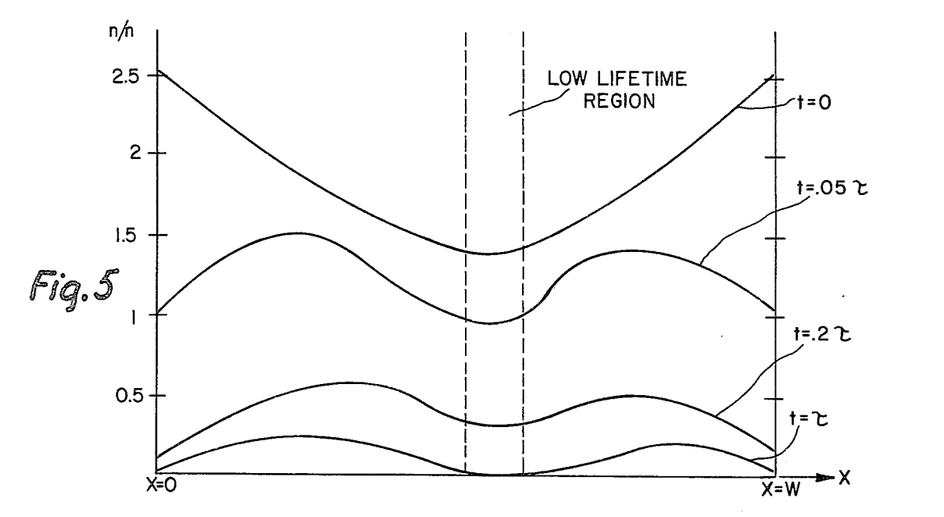
FIG. 5 illustrates in a manner similar to FIG. 2 the excess carrier concentration in the active region of a thyristor including a low lifetime region in accordance with the invention.
Figure 6:
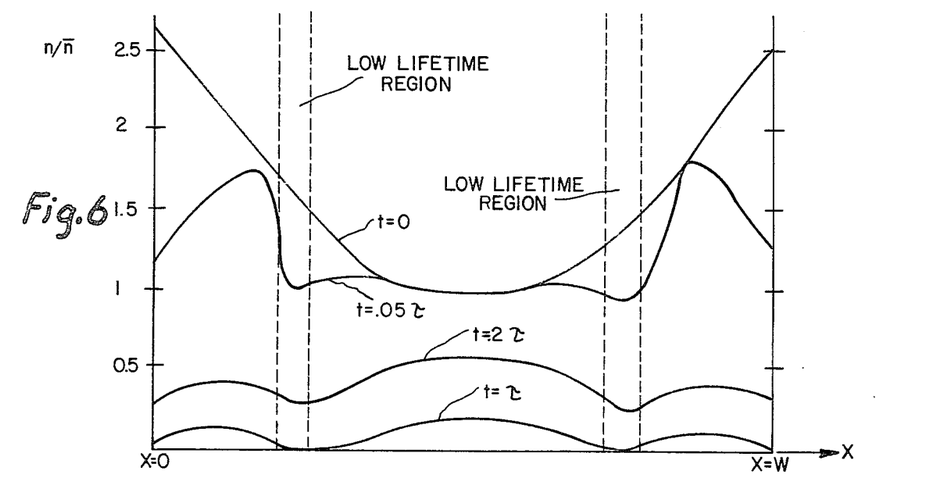
FIG. 6 is a graphical representation of the turn-off characteristics of a device in accordance with this invention having two limited regions of relatively low lifetime in the active region of a thyristor device.

FIG. 5 illustrates in a manner similar to FIG. 2 the excess carrier concentration in the active region of a thyristor in accordance with this invention as exemplified by FIG. 4. While the initial stage of turn-off as exemplified by the distributions at time $t=0$ and time $t=0.5\tau$, resembles somewhat the like distributions of FIG. 2, the distributions in the second stage of turn-off exhibit substantially more rapid recombination as a result of the addition of the region of low lifetime at the point of maximum excess carrier concentration during the second stage. In fact, even during the first stage of turn-off, the effect of the reduction in excess carrier concentration at the point of addition of the low lifetime region is apparent. The distribution at time $t=0.2\tau$ at FIG. 5 when compared to the distribution at the same time in FIG. 2, reveals that the excess carrier concentration in a device in accordance with the instant invention is on the order of ½ that of prior art devices.

Where desired, and in accordance with another embodiment of this invention, more than one limited region of relatively low lifetime may be provided within the active region of a device. An exemplary charge distribution diagram of the type of FIGS. 2 and 5 is illustrated at FIG. 6 wherein two low lifetime regions are provided as illustrated by the phantom lines. The further improvement in second stage turn-off speed is readily apparent from the diagram. The following tables quantitatively illustrate the effect of both a single and double low lifetime region on forward voltage drop in thyristors of the type illustrated in FIGS. 2-6. In each case, $t_{no}$ and $t_{po}$ are the quiescent carrier lifetimes for electrons and holes, respectively.

TABLE 1

EFFECT OF SINGLE LOW LIFETIME REGION ON FORWARD DROP (W = 150μ, $t_{no}$ = 10μsec, $t_{po}$ = 1μsec except where otherwise indicated.)

Case A: $t_{no}$ = 1μsec, $t_{po}$ = .1μsec over center 8μ only
Case B: $t_{no}$ = 1μsec, $t_{po}$ = .1μsec over center 16μ only
Case C: $t_{no}$ = 1μsec, $t_{po}$ = .1μsec over center 24μ only
Case D: $t_{no}$ = .1μsec, $t_{po}$ = .01μsec over center 16μ only
Case E: No Low Lifetime Region.

| CASE | VOLTAGE (in volts) | CURRENT (in amps/cm²) | MIN. ACTIVE REGION n VALUE |
|---|---|---|---|
| B | 1.0 | 142 | 6.7 × 10¹⁶ |
| E | 1.0 | 186 | 9.5 × 10¹⁶ |
| B | 1.5 | 1364 | 2.5 × 10¹⁷ |
| E | 1.5 | 1567 | 3.0 × 10¹⁷ |
| A | 2.0 | 3260 | 4.0 × 10¹⁷ |
| B | 2.0 | 3098 | 3.6 × 10¹⁷ |
| C | 2.0 | 2874 | 3.0 × 10¹⁷ |
| D | 2.0 | 1793 | 8.2 × 10¹⁶ |
| E | 2.0 | 3515 | 4.5 × 10¹⁷ |

TABLE 2

EFFECT OF DOUBLE LOW LIFETIME REGION ON FORWARD DROP (Same active region as for Table 1)

Case F: $t_{no}$ = 1μsec, $t_{po}$ = .1μsec over two 16μ regions centered 50μ and 100μ into the active region
Case E: No Low Lifetime Region.

| CASE | VOLTAGE (in volts) | CURRENT (in amps/cm²) | MIN. ACTIVE REGION n VALUE |
|---|---|---|---|
| F | 2.0 | 2600 | 2.4 × 10¹⁷ |
| E | 2.0 | 3515 | 4.5 × 10¹⁷ |

While some increase in forward voltage drop is produced in devices in accordance with this invention, the effect is substantially less than that produced in prior art devices wherein more rapid recombination has been provided by poisoning the lifetime of entire semiconductor layers. In accordance with this invention, only a limited layer or a partial layer is required having an orientation substantially perpendicular to the current flow in the device when the device is turned on. In accordance with this invention, this layer is located, as has been hereinabove discussed, within the active region at a point so as to most effectively reduce the peak excess carrier concentration during the second stage of turn-off. It may be generally stated that locating the low lifetime region essentially in the center of the active region provides satisfactory improvement without the need for more complex investigation of the exact location of peak excess carrier concentration.

A number of methods in accordance with this invention will be hereinbelow described to fabricate a device having a limited layer of relatively low lifetime within the active region of a semiconductor device. It is again emphasized that this technique is readily applicable to a wide variety of semiconductor devices and, accordingly, only generalized methods are illustrated it being understood that those skilled in the art will readily comprehend the application of the instant invention to particular devices.

Figure 7:
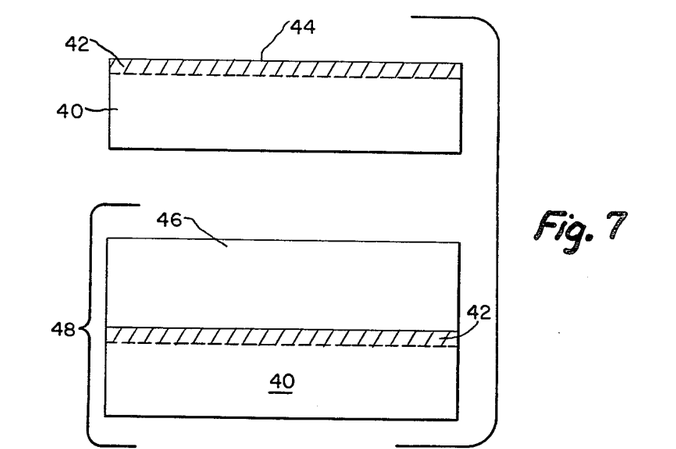
FIG. 7 illustrates an exemplary method in accordance with this invention for forming a limited region of relatively low lifetime in a junction semiconductor device.

Referring now to FIG. 7, an exemplary method for forming a limited region of relatively low lifetime in a semiconductor structure is illustrated. A semiconductor substrate 40 of a desired conductivity type is provided. Substrate 40 exhibits a first lifetime preferably being the lifetime desired in the region of the device to be fabricated in order to insure the required device characteristics as, for example, forward voltage drop. The lifetime in a limited region 42 of substrate 40 near surface 44 thereof is reduced by any one of a number of well known methods as, for example, but not limited to the diffusion of gold or platinum or by electron irradiation. The relatively low lifetime layer 42 which is produced is essentially parallel to the surface 44 and extends into substrate 40 a distance determined during the formation of layer 42. After layer 42 is formed a second layer 46 is grown, preferably epitaxially, on surface 44. Layer 46 is characterized by a relatively high lifetime with respect to the lifetime of layer 42 and is generally of the same characteristics of layer 40. A structure 48 is produced which forms an appropriate beginning structure for the formation of a number of semiconductor devices as, for example, diodes, thyristors and the like. Structure 48 is a single semiconductor layer having a more or less uniform lifetime throughout except for the limited region of relatively low lifetime 42 located generally at the center thereof.

Figure 8:
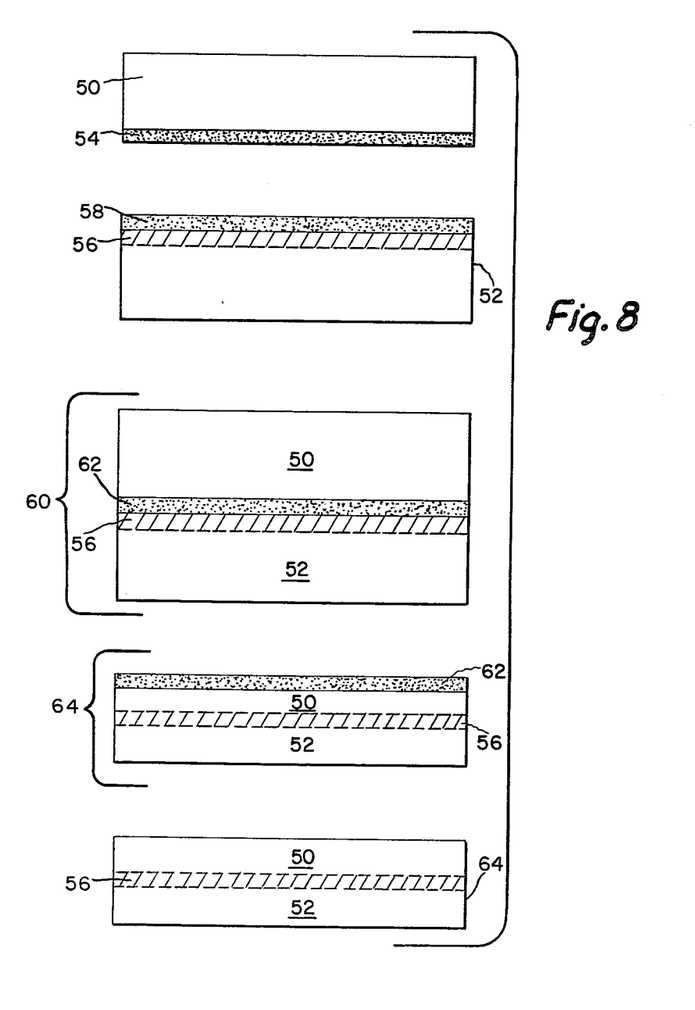
FIG. 8 illustrates another method in accordance with this invention for forming a low lifetime region in a semiconductor device.

FIG. 8 illustrates an alternative process for forming a semiconductor structure having a limited region of relatively low lifetime located therein. The structure of FIG. 8 may readily be formed by zone refining or by thermal gradient zone melting as will be described. First and second semiconductor wafers 50 and 52 of generally high lifetime are prepared. Wafer 50 includes at one surface thereof a solute layer 54 while wafer 52 includes a layer 56 of relatively low lifetime formed in the manner hereinabove described in conjunction with FIG. 7 and further includes overlying layer 56, a solute layer 58. Wafers 50 and 52 are joined to form structure 60 which includes low lifetime layer 56 therein along with solute layer 62 which is the combination of solute layers 54 and 58. The solute is zone refined to the upper layer of device 62 by the application of an appropriate thermal gradient thereto and then removed to produce device 64 which is of the desired configuration, having a relatively high lifetime except in region 56 located generally at the center thereof which is of relatively low lifetime and parallel to the major surfaces of wafer 64.

Figures 9A, 9B:
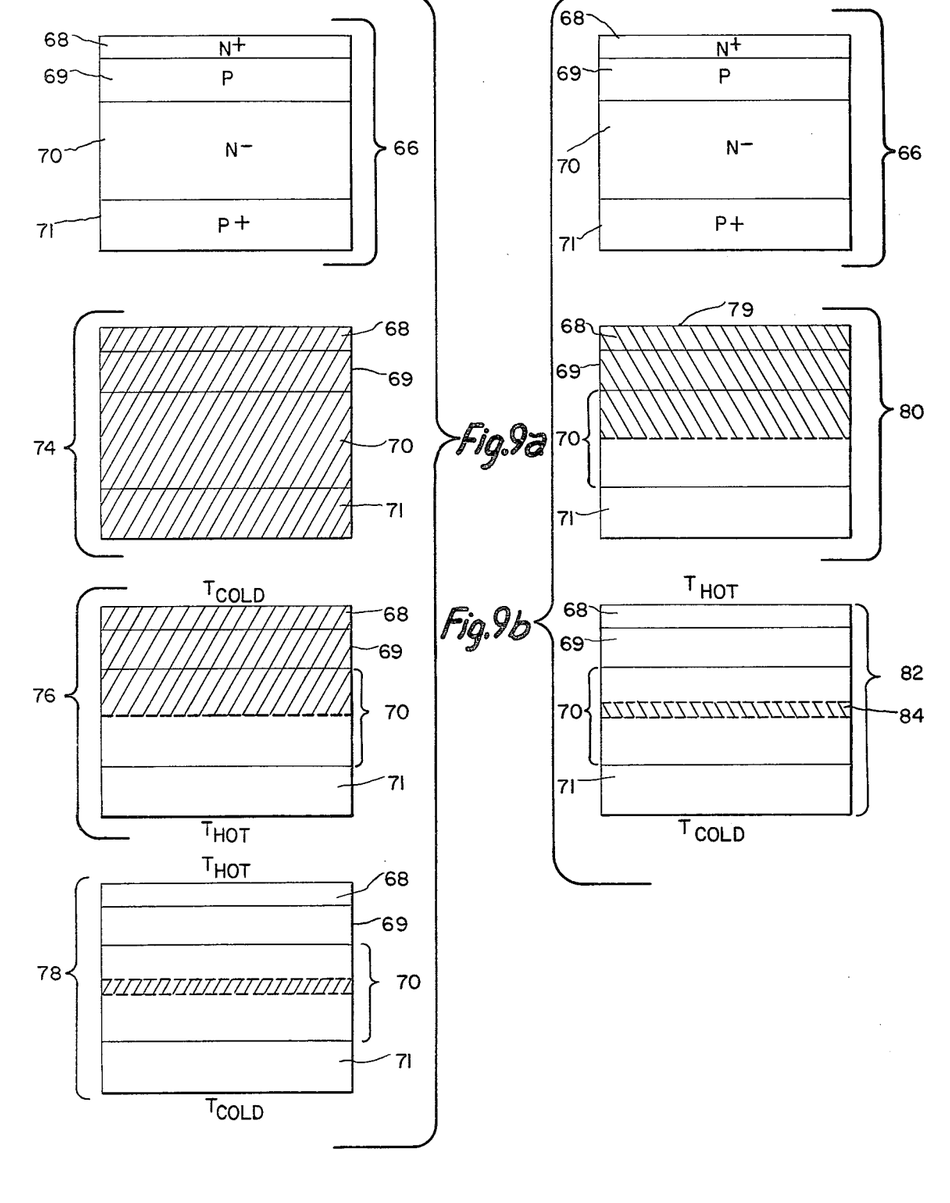
FIGS. 9a and 9b illustrate two further methods for forming low lifetime regions of limited extent in thyristor semiconductor devices in accordance with this invention.

FIGS. 9a and 9b illustrate methods in accordance with this invention for fabricating thyristor semiconductor devices having appropriately located limited regions of relatively low lifetime as have been described. Referring first to FIG. 9a, a thyristor device 66 is provided of conventional type including layers 68 through 71 of the conductivity types illustrated. Device 66 is preferably designed to have lifetimes in the various regions which provide the desired device characteristics, and particularly formed voltage drop. Device 66 is subjected to any of the lifetime poisoning processes of which a certain number have been described hereinabove and others will be readily appreciated by those skilled in the art, to produce device 74 which is substantially uniformly poisoned. Device 74 is subjected to a thermal gradient as illustrated which causes the removal of lifetime killing centers through the mechanism of selected annealing from the device as illustrated. The presence of lifetime killing centers in the device is indicated by the presence of shading in the drawing. The thermal gradient produces devices 76 wherein the lifetime killing centers are present only in the upper portion of the device. Reversing the applied thermal gradient produces the finished device 78 which includes a limited region of relatively low lifetime appropriately located in the n-base layer of the device.

FIG. 9b illustrates a variation on the method of FIG. 9a wherein one of the temperature gradient steps is eliminated by initially poisoning the lifetime of the device in the upper portion thereof only. This may be readily accomplished by diffusion from surface 79 of lifetime killing centers for a limited time such that the depth of diffusion of such centers is controlled. Device 80 which is thereby produced is substantially identical to device 76 which is produced in accordance with the method of FIG. 9a after the first thermal gradient step. The final device 82 which is produced is substantially identical to device 78, low lifetime region 84 being appropriately located in n-base layer 70 and parallel to the device surfaces.

Figure 10:
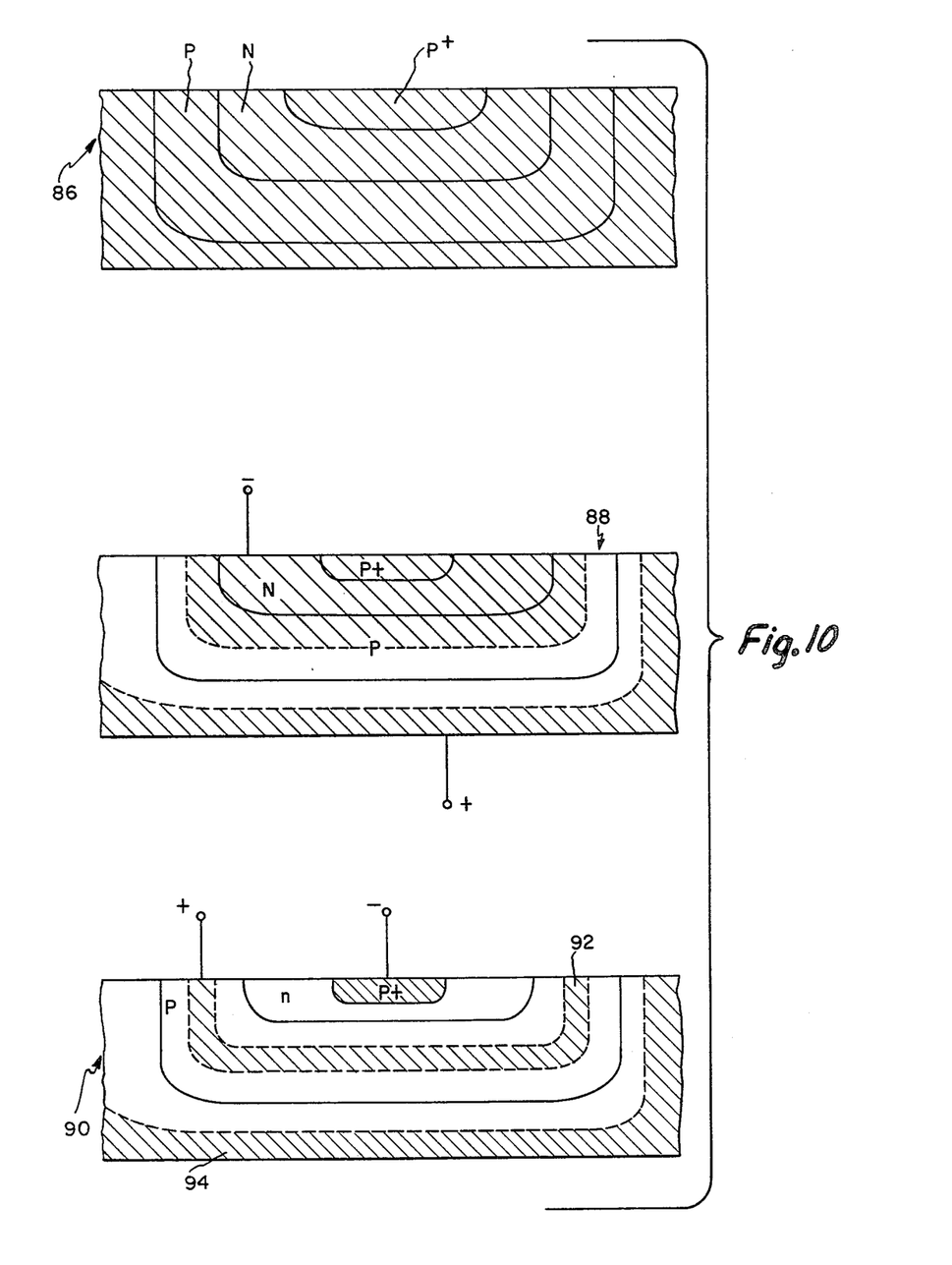
FIG. 10 illustrates a method for forming a limited region of relatively low lifetime in the collector of a transistor semiconductor device in accordance with this invention.

FIG. 10 illustrates a method in accordance with this invention for providing a relatively low lifetime region in a triple diffused transistor which method includes the application of a constant temperature in conjunction with an electric field to the device during formation. A device 86 is provided having uniformly distributed lifetime killing centers which may be introduced as has been hereinabove described. Device 86 is raised to an elevated temperature with the simultaneous application of a bias voltage thereto as illustrated. The lifetime killing centers are distributed by the simultaneous application of the bias in the high temperature environment to produce device 88. This selective annealing is due to the fact that the presence of an electric field lowers the temperature threshold for the annealing temperature of several species of, for example, platinum complexes which those skilled in the art will appreciate to be lifetime poisoning centers. This allows for certain types of lifetime profiles in which the contour of the high recombination rate region which remains after the annealing process conforms to the edge of the depletion region under the applied bias conditions. Device 88, therefore, will be appreciated to include lifetime poisoning centers in those regions of the device except the region depleted by the bias voltage. Similarly, the application of a bias voltage as illustrated for device 90 further removes lifetime poisoning recombination centers from those portions of the device except where shading is present. A region 92 of relatively low lifetime remains in the appropriate portion of the collector layer of the device to provide for rapid turn-off of the device. Those lifetime poisoning centers which remain in substrate 94 have no substantial effect on the operation of the device and may therefore be ignored.

Figure 11:
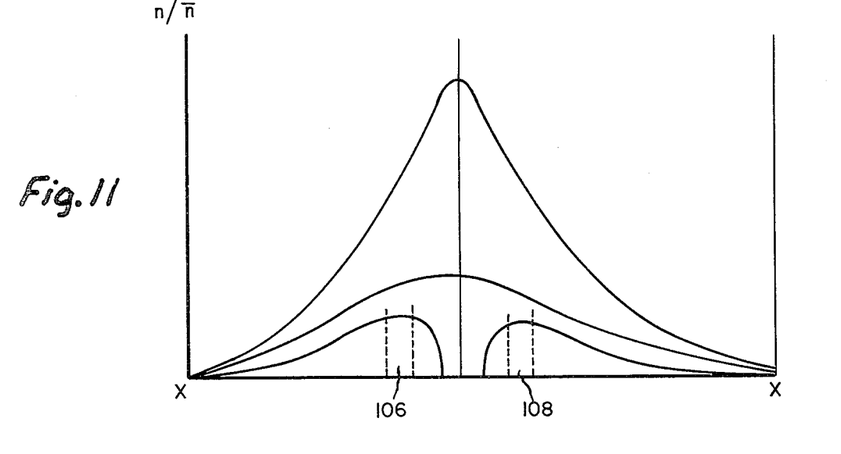
FIGS. 11 and 12 illustrate graphically and structurally the application of this invention to a junction semiconductor device having symmetrical impurity concentrations.
Figure 12:
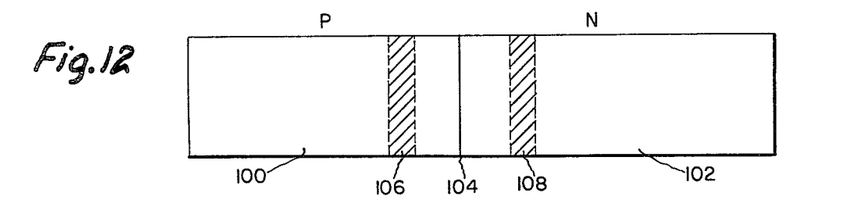

While the advantages of this invention may be especially usefully employed in conjunction with thyristor semiconductor devices, the teachings hereof are not so limited and FIGS. 11 through 20 are illustrative of the application of this invention to various other types of semiconductor devices wherein the advantages of rapid turn-off along with the maintenance of a relatively low forward voltage drop are achieved. FIGS. 11 and 12 illustrate, respectively, the excess carrier concentration and an exemplary physical structure for a uniformly doped p-n junction semiconductor device. The device is essentially symmetrical and includes, as will be readily appreciated by reference to FIG. 12, p-conductivity type region 100 and n-conductivity type region 102, regions 100 and 102 being characterized by substantially equal impurity concentrations of opposite type and forming junction 104 therebetween. FIG. 11 illustrates the excess carrier concentration in the device of FIG. 12 as a function of the location within the device. It will be appreciated that the turn-off of a device of the type illustrated in FIG. 12 proceeds in accordance with the same two stage mechanism hereinabove described in conjunction with thyristor devices. Accordingly, FIG. 12 illustrates the distribution of excess carriers with respect to time and is seen to include a first stage wherein the majority of excess carriers is centered about the junction and a second stage wherein excess carriers are reduced essentially to zero in the vicinity of the junction, the majority of carriers being located in regions 106 and 108. In accordance with this invention, limited regions of relatively low lifetime 106 and 108 with respect to the lifetime of regions 100 and 102 are provided in the device of FIG. 12 allowing the excess carriers in the device to more rapidly recombine during the second stage of turn-off providing the desired improved operation of the device.

Figure 13:
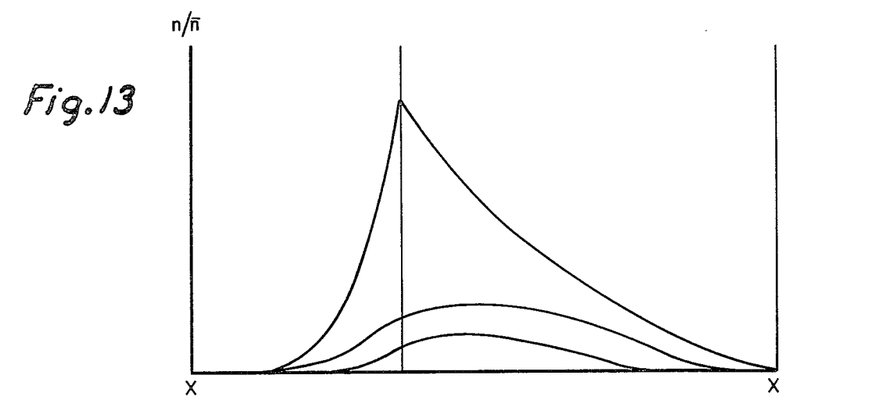
FIGS. 13 and 14 illustrate the application of this invention to a device having nonsymmetrical impurity concentrations.
Figure 14:
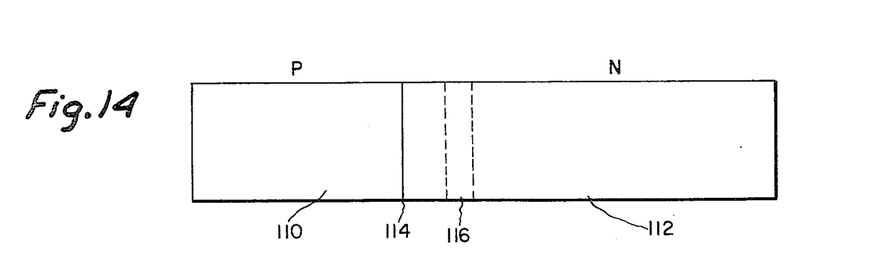

FIGS. 13 and 14 are analogous to FIGS. 11 and 12 but apply to nonuniformly doped diodes of the type illustrated, for example, in FIG. 14 and including p-conductivity type region 110 and n-conductivity type region 112 forming junction 114 therebetween. Reference may be made to FIG. 13 wherein, once again, the two stages of turn-off may be readily ascertained. The structure of FIG. 14 produces a somewhat different excess carrier distribution than the structure of FIG. 12 insofar as the lifetime of the p-conductivity type region 110 is lower due to higher impurity concentration therein. Accordingly, the excess carrier distribution within region 110 is not significant in determining the turn-off time during the second stage of the turn-off mechanism. Limited region of relatively low lifetime 116 accordingly is required only within region 112 at the point where the excess carrier concentration would otherwise be highest.

Figure 15:
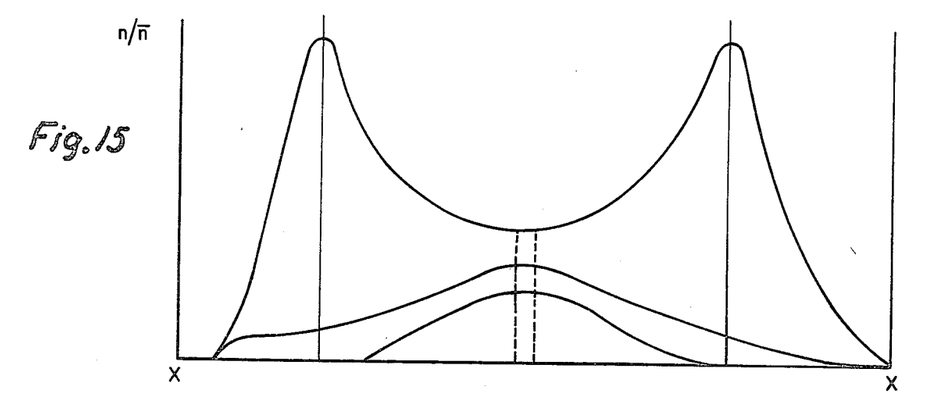
FIGS. 15 and 16 illustrate the application of this device to a PIN diode.
Figure 16:
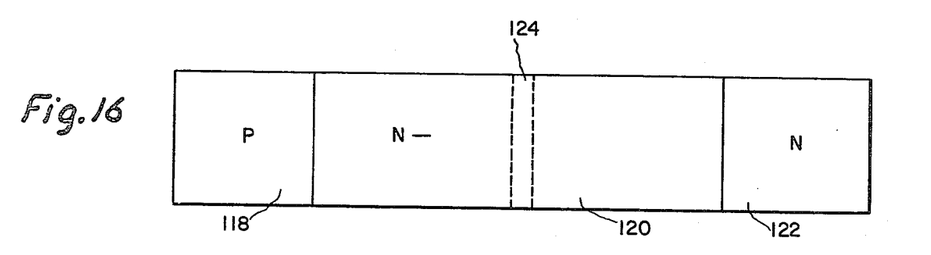

FIGS. 15 and 16 illustrate the application of this invention to a PIN diode as illustrated in FIG. 16 and including p-conductivity type region 118, intrinsic region 120 and n-conductivity type region 122. The distribution of excess carriers illustrated in FIG. 15 is along the same scale as FIG. 16. The second stage of turn-off may be readily understood by reference to FIG. 15, to comprise mostly of recombination of excess carriers in the intrinsic region of the device. Accordingly, as illustrated in FIG. 16, relatively low lifetime region 124 is included at the point within intrinsic region 120 where the highest excess carrier concentration occurs.

Figure 17:
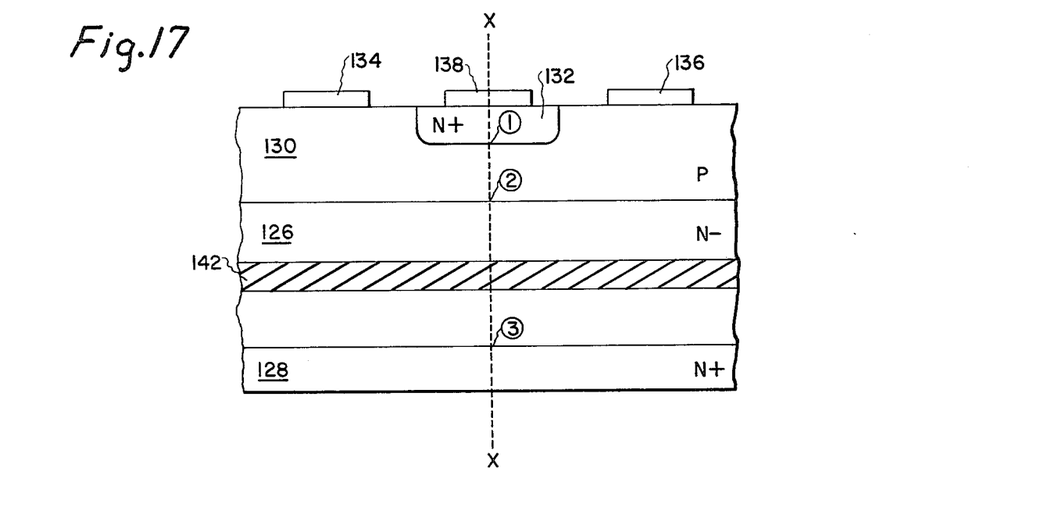
FIGS. 17 through 18 illustrate the application of this invention to high power transistor semiconductor devices.
Figure 18:
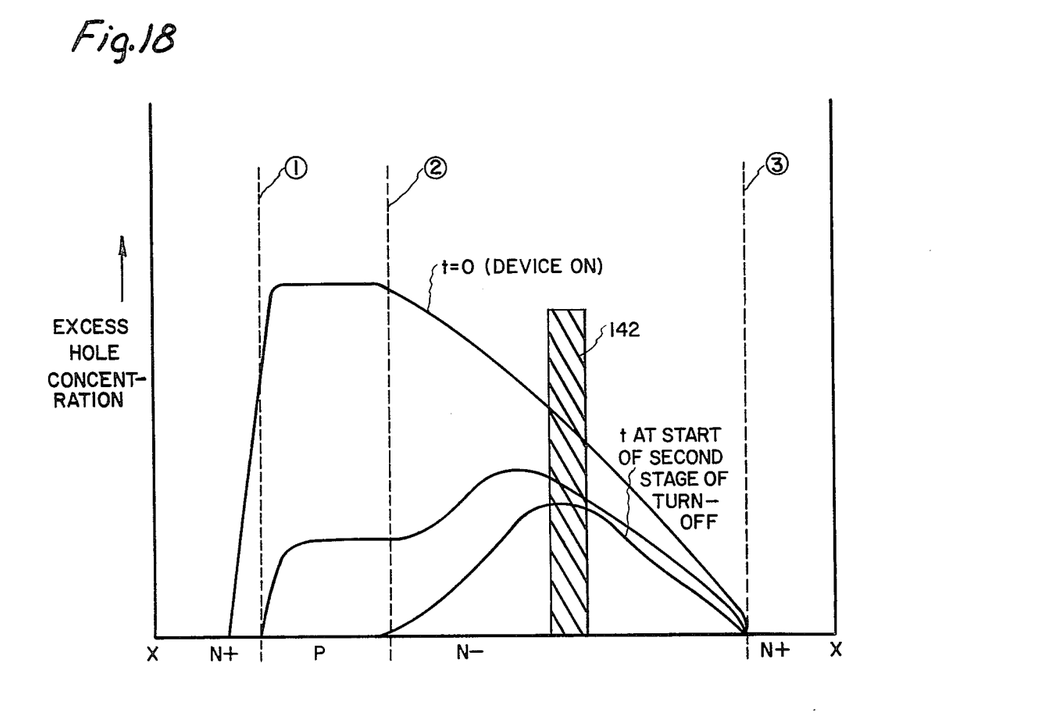

FIG. 17 illustrates the structure of a high power transistor of the type including multiple fingers which is well known to those skilled in the art. The transistor of FIG. 17 includes collector 126 which may conveniently be of n-conductivity type material, layer 128 which is of higher impurity concentration than layer 126 and provides an appropriate contact to the device, p-conductivity type base region 130 and n+-conductivity type emitter region 132. Electrodes 134 and 136 which may conveniently be part of a multiple finger base structure are the base contacts which electrode 138 is the emitter contact of the device. It will be understood that the precise form of the transistor of FIG. 17 is not critical to the application of the teachings of this invention thereto. A section x—x through FIG. 17 is designated. FIG. 18 illustrates the excess carrier concentration along line x—x. It will be seen by reference to FIG. 18 that the peak concentration of excess carriers during the second stage of turn-off occurs in region 142 which is physically located in the collector layer 126 of the device. To paraphrase, region 142 is the location where the peak amount of carrier recombination occurs during the second stage of turn-off of the transistor of FIGS. 17 and 18. From FIG. 18 it can be seen that during the first stage of turn-off, holes can be pulled out of P-type base 130 through base electrode contacts 134 and 136 of the transistor of FIG. 17. Excess charge distribution diagram 18 is somewhat simplified, illustrating the excess charge at the initiation of the first stage of turn-off and at the onset of the second stage of turn-off.

Figure 19:
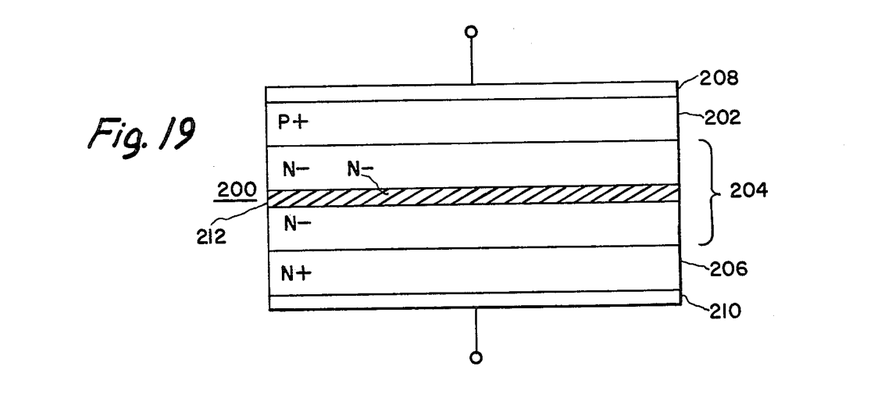
FIG. 19 is a representation of the PIN diode of the invention with a region of reduced carrier lifetime situated within the I intrinsic layer at a suitable approximation to its optimal location.
Figure 20:
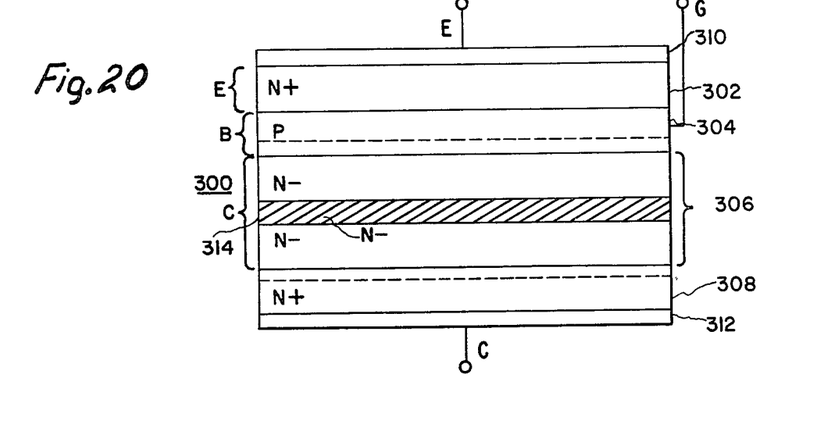
FIG. 20 is a representation of the transistor semiconductor device of the invention with a region of reduced carrier lifetime situated within the collector region of the transistor at a suitable approximation to its optimal location.

FIG. 19 illustrates a PIN diode device 200 of the invention including three layers of semiconductor material 202, 204 and 206 of alternate conductivity type arranged in sandwich-like relationship. Semiconductor layer 202 is comprised of heavily doped P-type material denoted P+. Semiconductor layer 204 which is sandwiched between layers 202 and 206 is comprised of lightly doped N-type semiconductor material (this lightly doped material is denoted N—) or intrinsic semiconductor material (I). Semiconductor layer 206 is comprised of heavily doped N-type material denoted N+. As shown, electrical contacts 208 and 210 are provided to P-type semiconductor layer 202 and N-type semiconductor layer 206, respectively. A region of reduced carrier lifetime 212 is situated within intrinsic semiconductor layer 204 near the middle portion of layer 204 and oriented generally perpendicular to a current which may flow through device 200 when it is excited by an excitation voltage applied to its electrical contacts 208 and 210. It should be noted that because region 212 is situated in the middle portion of layer 204, region 212 is thus located a substantial distance away from the function formed between P layer 202 and N— (intrinsic) layer 204 and likewise a substantial distance from the junction formed between layer 206 and layer 204. A transistor semiconductor device 300 of the invention is shown in FIG. 20. This transistor includes an emitter region 302 designated E, a base region 304 designated B and a collector region 306 designated C. Regions 302, 304 and 306 are respectively comprised of semiconductor materials of alternate conductivity type. A PN junction is formed between regions 302 and 304. Likewise, a PN junction is formed between regions 304 and 306. A "depletion region stop" region 308 is situated in contact with collector region 306 as shown in FIG. 20. Region 308 is heavily doped with N type impurities and thus designated N+ in the drawing. Collector region 306 is comprised of lightly doped semiconductor material and is designated N—. Regions 302 and 304 are respectively designated as N+ and P semiconductor regions in the drawing. Emitter region 302 and collector region 306 are respectively provided with electrical contacts 310 and 312 to enable connection of transistor 300 to external electrical circuitry. Base region 304 is also provided with an electrical contact (not shown). The space between the dotted lines of transistor 300 represents the depletion region of the device.

To enable transistor 300 to operate at high switching speeds, lightly doped collector region 306 is provided with a region 314 of reduced carrier lifetime which is included in, and substantially limited to, the portion of the volume of collector region 306 in which the peak amount of carrier recombination occurs during the second stage of turn-off of the collector-to-emitter current of transistor 300. Region of reduced carrier lifetime 314 is situated near the middle portion of lightly doped collector region 306 and is thus a substantial distance from the collector-base junction. Region 314 is oriented generally perpendicular to the flow of collector-to-emitter current through transistor 300.

Figure 21:
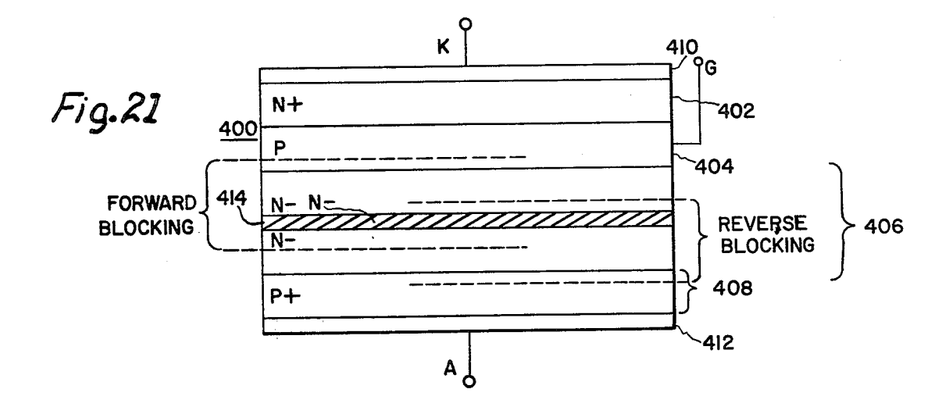
FIG. 21 is a representation of the four layer thyristor semiconductor device of the invention with a region of reduced carrier lifetime situated within the second base layer of the thyristor device at a suitable approximation to its optimal location.

FIG. 21 shows the four layer thyristor semiconductor device 400 of the invention. Thyristor 400 includes a cathode layer 402, a first base layer 404, a lightly doped second base layer 406 and an anode layer 408, all comprised of semiconductor material of alternating conductivity types. In this particular embodiment, regions 402, 404, 406 and 408 are respectively shown to be N+, P, N− and P+ regions. Cathode region 402 and anode region 408 are provided with electrical contacts 410 and 412 to facilitate connection of thyristor 400 to external electrical circuitry. First base region 404 is likewise provided with an electrical contact G. FIG. 21 shows the depletion region of thyristor 400 when it is in the forward blocking state and when it is in the reverse blocking state, designated by the space between the planes formed by the respective dotted lines shown in the drawing.

To enable thyristor 400 to operate at high switching speeds, a region of reduced carrier lifetime 414 is situated within lightly doped second base layer 406. Region 414 includes, and is substantially limited to, the portion of the volume of second base layer 406 in which the peak amount of carrier recombination occurs during the second stage of turnoff of thyristor 400. Region 414 is generally situated near the middle portion of second base layer 406 and is oriented generally perpendicular to the flow of current from the cathode 402 to the anode 408 of thyristor 400.

While only certain preferred features of the invention have been shown by way of illustration, many modifications and changes will occur to those skilled in the art. It is, therefore, to be understood that the appended claims are intended to cover all such modifications and changes as fall within the true spirit of the invention.

What is claimed is:

1. In a PIN semiconductor diode exhibiting first and second stages of turn-off and including a layer of P type semiconductor material, a layer of intrinsic semiconductor material I, and a layer of N-type semiconductor material in a sandwich-like relationship, a P-I junction being formed between said P-type layer and said I layer, and an I-N junction being formed between said I layer and said N-type layer, said P-type layer and said N-type layer each having an electrical contact for connecting said diode to external electrical circuitry, the improvement comprising:

a region of reduced carrier lifetime situated within said intrinsic semiconductor layer including, and substantially limited to, the portion of the volume thereof in which the peak amount of carrier recombination occurs during the second stage of turn-off of said diode caused by changing a forward bias voltage applied to the electrical contacts of said diode to a reverse bias voltage, said region of reduced carrier lifetime oriented generally perpendicular to the flow of current through said diode and generally situated near the middle portion of said layer of intrinsic semiconductor material, said intrinsic semiconductor layer including a first region exhibiting a carrier recombination lifetime greater than that of said region of reduced carrier lifetime and situated between said region of reduced carrier lifetime and said P-I junction, and a second region exhibiting a carrier recombination lifetime greater than that of said region of reduced carrier lifetime and situated between said region of reduced carrier lifetime and said I-N junction, whereby carrier recombination during device turn-off is enhanced so as to result in decreased turn-off time.

2. The PIN semiconductor diode of claim 1 wherein said region of reduced carrier lifetime occupies less than 25% of the volume of said intrinsic semiconductor layer.

3. The PIN semiconductor diode of claim 2 wherein said region of reduced carrier lifetime exhibits a lifetime less than 60 percent of the lifetime of said intrinsic semiconductor layer.

4. In a transistor exhibiting first and second stages of turn-off, said transistor including a lightly doped collector region and a base region with a collector-base junction situated therebetween and including an emitter region with an emitter-base junction situated between said emitter and base regions, each of said collector, base and emitter regions having an electrical contact situated thereon to connect said device to external electrical circuitry, the turn-on and turn-off of the collector-to-emitter current of said transistor device being controlled by base current applied to said base electrical contact, the improvement comprising:

a region of reduced carrier lifetime situated within said lightly doped collector region including, and substantially limited to, the portion of the volume thereof in which the peak amount of carrier recombination occurs during the second stage of turn-off of the collector-to-emitter current of said transistor, said region of reduced carrier lifetime oriented generally perpendicular to the flow of collector-to-emitter current through said device, and generally situated near the middle portion of said collector region, said collector region including a region exhibiting a carrier recombination lifetime greater than that of said region of reduced carrier lifetime and situated between said region of reduced carrier lifetime and said collector-base junction, whereby carrier recombination during device turn-off is enhanced so as to result in decreased turn-off time.

5. The transistor device of claim 4 wherein said region of reduced carrier lifetime occupies less than 25% of the volume of said collector region.

6. The transistor device of claim 5 wherein said region of reduced carrier lifetime exhibits a carrier lifetime less than 60% of the lifetime of said collector region.

7. In a four-layer thyristor semiconductor device exhibiting first and second stages of turn-off and including a cathode layer, a first base layer, a lightly doped second base layer, and an anode layer of alternate conductivity types, and including first, second and third P-N junctions between said respective layers, said cathode, first base and anode layers each having an electrical contact for connecting said thyristor semiconductor device to external electrical circuitry, said thyristor semiconductor device adapted for electrical switching to provide a first relatively low resistance turned-on state and a second relatively high resistance turned-off voltage blocking state, the state of said semiconductor device being controlled by current applied to said first base layer, the improvement comprising:

a region of reduced carrier lifetime situated within said lightly-doped second base layer including, and substantially limited to, the portion of the volume thereof in which the peak amount of carrier recombination occurs during the second stage of turn-off of said device, said region of reduced carrier lifetime oriented generally perpendicular to the flow of current from the cathode to the anode through said device, and generally situated near the middle portion of said second base layer, said second base layer including a first region exhibiting a carrier recombination lifetime greater than that of said region of reduced carrier lifetime and situated between said region of reduced carrier lifetime and said second P-N junction, and a second region exhibiting a carrier recombination lifetime greater than that of said region of reduced carrier lifetime and situated between said region of reduced carrier lifetime and said third P-N junction, whereby carrier recombination during device turn-off is enhanced so as to result in decreased turn-off time.

8. The four layer thyristor semiconductor device of claim 7 wherein said region of reduced carrier lifetime occupies less than 25% of the volume of said second base layer.

9. The four layer thyristor semiconductor device of claim 8 wherein said region of reduced carrier lifetime exhibits a lifetime less than 60% of the lifetime of said second base layer.

* * * * *